(12) United States Patent
Wang et al.

(10) Patent No.: US 9,973,221 B2
(45) Date of Patent: May 15, 2018

(54) NONLINEAR SYSTEM DISTORTION CORRECTION DEVICE AND METHOD

(71) Applicant: ZTE CORPORATION, Shenzhen (CN)

(72) Inventors: Lei Wang, Shenzhen (CN); Zhengjian Dai, Shenzhen (CN); Weiming Pan, Shenzhen (CN); Zhe Zhang, Shenzhen (CN); Mei Huang, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 0 days. days.

(21) Appl. No.: 15/318,632

(22) PCT Filed: Nov. 5, 2014

(86) PCT No.: PCT/CN2014/090401
§ 371 (c)(1),
(2) Date: Dec. 13, 2016

(87) PCT Pub. No.: WO2015/188578
PCT Pub. Date: Dec. 17, 2015

(65) Prior Publication Data
US 2017/0117927 A1    Apr. 27, 2017

(30) Foreign Application Priority Data

Jun. 13, 2014    (CN) .......................... 2014 1 0264690

(51) Int. Cl.
*H03F 3/24*    (2006.01)
*H04B 1/04*    (2006.01)
*H04L 25/03*   (2006.01)

(52) U.S. Cl.
CPC ............. *H04B 1/0475* (2013.01); *H03F 3/24* (2013.01); *H04L 25/03057* (2013.01);
(Continued)

(58) Field of Classification Search
CPC ............. H04L 27/368; H04L 25/03343; H04L 25/03057; H04L 25/03885; H04L 27/367; H04B 2001/0425; H04B 2001/0433
(Continued)

(56) References Cited

U.S. PATENT DOCUMENTS 6,133,789 A * 10/2000 Braithwaite ............ H03F 1/345
330/149
7,151,405 B2 * 12/2006 Nezami .................. H03F 1/3247
330/103
(Continued)

FOREIGN PATENT DOCUMENTS

CN    102281221 A    12/2011
WO    2008006069 A2    1/2008

OTHER PUBLICATIONS

PCT International Search Report dated Mar. 24, 2015, Application No. PCT/CN2014/090401, 3 Pages.
(Continued)

*Primary Examiner* — Emmanuel Bayard
(74) *Attorney, Agent, or Firm* — Ling Wu; Stephen Yang; Ling and Yang Intellectual Property

(57) ABSTRACT

The present document discloses an apparatus and method for nonlinear system distortion correction. The apparatus includes: apparatus for nonlinear system distortion correction including: a robustness signal source generator, arranged to generate a robustness signal provided to an adaptive device; the adaptive device, arranged to collect a main link signal output by a signal generator and a feedback signal returned by the main link signal via a feedback link, and generate a correction parameter according to the main link signal, the feedback signal and the robustness signal; and a pre-corrector, arranged to according to the correction
(Continued)

parameter perform pre-correction processing on the main link signal output by the signal generator.

18 Claims, 3 Drawing Sheets

(52) U.S. Cl.
CPC ............... *H04B 2001/0408* (2013.01); *H04B 2001/0433* (2013.01); *H04B 2001/0491* (2013.01)

(58) Field of Classification Search
USPC .................................................. 375/295–297
See application file for complete search history.

(56) References Cited

U.S. PATENT DOCUMENTS

| | | | | |
|---|---|---|---|---|
| 7,251,290 B2* | 7/2007 | Rashev | ................ | H03F 1/0277 327/133 |
| 7,583,754 B2 | 9/2009 | Liu | | |
| 7,602,244 B1* | 10/2009 | Holmes | ................ | H03F 1/0266 330/149 |
| 7,796,960 B1* | 9/2010 | Rashev | ............. | H04L 25/03063 455/114.3 |
| 8,354,884 B2* | 1/2013 | Braithwaite | .......... | H03F 1/3247 330/149 |
| 8,471,632 B2* | 6/2013 | Onishi | ................. | H03F 1/3247 330/149 |
| 8,498,590 B1* | 7/2013 | Rashev | ............. | H04B 1/0475 375/296 |
| 9,077,409 B2* | 7/2015 | Lozhkin | ............... | H04B 1/0475 |
| 9,189,458 B1* | 11/2015 | Langer | ................... | G06F 17/16 |
| 2003/0058959 A1* | 3/2003 | Rafie | ..................... | H03F 1/3247 375/296 |
| 2003/0156658 A1* | 8/2003 | Dartois | ................ | H03F 1/3294 375/297 |
| 2004/0105510 A1* | 6/2004 | Tomerlin | .............. | H04L 27/368 375/297 |
| 2004/0246048 A1* | 12/2004 | Leyonhjelm | ......... | H03F 1/3247 330/2 |
| 2004/0257157 A1* | 12/2004 | Sahlman | ............... | H03F 1/3247 330/149 |
| 2005/0009479 A1* | 1/2005 | Braithwaite | .......... | H03F 1/3235 455/114.3 |
| 2005/0180526 A1 | 8/2005 | Kim et al. | | |
| 2005/0231279 A1* | 10/2005 | Moffatt | ................. | H03F 1/3247 330/149 |
| 2006/0078065 A1* | 4/2006 | Cai | ....................... | H03F 1/3247 375/297 |
| 2008/0265996 A1* | 10/2008 | Kim | ...................... | H03F 1/3247 330/291 |
| 2010/0009642 A1* | 1/2010 | Pratt | ..................... | H03F 1/0244 455/127.1 |
| 2010/0283540 A1* | 11/2010 | Davies | ................. | H03F 1/3247 330/149 |
| 2011/0075745 A1* | 3/2011 | Kleider | ............. | H04L 25/03057 375/260 |
| 2011/0201287 A1* | 8/2011 | Pratt | ..................... | H03F 1/3247 455/126 |
| 2012/0154038 A1* | 6/2012 | Kim | ...................... | H03F 1/3247 330/149 |
| 2012/0155572 A1* | 6/2012 | Kim | ...................... | H03F 1/3247 375/297 |
| 2013/0120062 A1* | 5/2013 | Lozhkin | ................ | H03F 1/3247 330/149 |
| 2015/0146819 A1* | 5/2015 | Chowdhury | .......... | H03F 1/0227 375/296 |
| 2015/0372646 A1* | 12/2015 | Briffa | ..................... | H03F 1/025 330/297 |

OTHER PUBLICATIONS

Extended European Search Report dated May 23, 2017, Application No. EP 14894708.8, 9 Pages.

\* cited by examiner

NONLINEAR SYSTEM DISTORTION CORRECTION DEVICE AND METHOD

CROSS-REFERENCE TO RELATED APPLICATIONS

This application is the U.S. national phase of PCT Application No. PCT/CN2014/090401 filed on Nov. 5, 2014, which claims priority to Chinese Patent Application No. 201410264690.1 filed on Jun. 13, 2014, the disclosures of which are incorporated in their entirety by reference herein.

TECHNICAL FIELD

The present document relates to the field of communication technology, and in particular, to an apparatus and method for nonlinear system distortion correction.

BACKGROUND

With the development of mobile communications and increasingly scarce spectrum resources, it is often difficult for operators to obtain frequency spectrums with enough bandwidths within one frequency band. Each operator will more frequently establish a cross-band communication system in the future. This will cause communication device systems which are required to process cross-band ultra-wideband signals. Meanwhile, the operators' requirements for capital expenditure (CAPEX) and operating expense (OPEX) will gradually become a primary consideration when devices are selected. For a wireless communication base station system, about 80% of power consumption is generated by a radio frequency power amplifier (PA) in a radio remote unit (RRU) module. Thus, with the development of the digital mobile communication technology, high-efficiency power amplifiers (hereinafter referred to as power amplifiers) become a requirement which each of major system device manufacturers must meets. A major problem which the high-efficiency power amplifiers face is intermodulation interference generated when the power amplifiers operating close to a saturation region in a modern high-efficiency modulation mode, resulting in the power amplifiers generating serious nonlinear distortion. The digital pre-distortion technology becomes a basic power amplifier linearization function module of RRU systems in the current mainstream communication devices. In summary, the digital pre-distortion technology in the RRU systems is required to cope with cross-band ultra-wideband signals under the current operating condition.

This condition brings a challenge to systems using the power amplifier linearization technology. All the current digital pre-distortion technologies are based on an off-line self-adaptive and iterative technique in which digital pre-distortion information cannot always completely follows the change in actual links. This problem appears to be particularly prominent under the configuration of cross-band ultra-wideband signals. For instance, it may be discovered in the actual test that, in the mode mixing cross-band application of Time Division-Synchronous Code Division Multiple Access (TD-SCDMA) signals and Time Division Duplexing-Time Division Long Term Evolution (TDD-LTE) signals, under certain configuration conditions, when a cell is initially established, data which is set by a predistorter to extract linearization parameters is single frequency band because of no service in service timeslots of a certain frequency band. When services in the frequency band are increased, the predistorter cannot update the linearization parameters in real time, after the cross-band signals in the actual test go through the linearization parameters extracted by the single frequency band, an abrupt change of more than ten dBs will occur in output power, and the frequency spectrum is abnormal, which easily causes damage to the power amplifiers of the systems and huge harm to system robustness.

SUMMARY

Embodiments of the present document provide an apparatus and method for nonlinear system distortion correction to at least solve the problem of poor system robustness in the prior art.

In order to solve the above technical problem, on the one hand, the present document provides an apparatus for nonlinear system distortion correction, including:

a robustness signal source generator, arranged to generate a robustness signal provided to an adaptive device;

the adaptive device, arranged to collect a main link signal output by a signal generator and a feedback signal returned by the main link signal via a feedback link, and generate a correction parameter according to the main link signal, the feedback signal and the robustness signal; and a pre-corrector, arranged to according to the correction parameter perform pre-correction processing on the main link signal output by the signal generator.

Further, the adaptive device includes:

a data collection unit, arranged to collect the main link signal output by the signal generator and the feedback signal returned by the main link signal via the feedback link;

a matrix composition unit, arranged to generate a linearization parameter extraction matrix Rr and a target matrix Zr according to the main link signal and the feedback signal, generate a linearization parameter extraction matrix Rs and a target matrix Zs according to the robustness signal, and perform matrix composition on the Rs, Zs and the Rr, Zr to obtain matrixes R and Z; and a correction parameter generation unit, arranged to extract a linearization parameter according to the matrixes R and Z, and use the linearization parameter as the correction parameter to be loaded into the pre-corrector.

Further, the pre-corrector includes:

an index address acquisition unit, arranged to calculate an amplitude value or power of the main link signal to obtain an index address of a correction signal;

a correction signal acquisition unit, arranged to look up a corresponding lookup table according to the index address, and generate the correction signal according to contents of the lookup table; and a pre-correction processing unit, arranged to perform the pre-correction processing on the main link signal output by the signal generator according to the correction signal and the correction parameter.

Further, the pre-correction processing unit performs the pre-correction processing according to formulas (1), (2) and (3):

$$y(n) = F_{U,X}(U,X) \qquad (1)$$

$$U = [U(n), U(n-1), \ldots, U(n-K)] \qquad (2)$$

$$X = [x(n), x(n-1), \ldots, x(n-J)] \qquad (3)$$

where, y is a pre-corrected signal; n is a signal sampling time serial number; $F_{U,X}(\bullet)$ is a pre-correction function, the correction parameter being a coefficient in the pre-correction function $F_{U,X}(\bullet)$; U is a vector of the correction signal; X is a vector of the main link signal; K is maximum delay of the correction signal; and J is maximum delay of the main link signal.

Further, the matrix composition unit performs the matrix composition using formulas (4) and (5):

$$R = a \times Rs + b \times Rr \quad (4)$$

$$Z = a \times Zs + b \times Zr \quad (5)$$

where, a and b are weighting coefficients.

Further, the robustness signal source generator is arranged to generate a robustness signal by the following way:

performing frequency conversion, filtering and frequency shift processing on a baseband signal to obtain the main link signal, and performing data property processing on the main link signal to obtain the robustness signal.

Further, the adaptive device performs the data property processing on the main link signal and the feedback signal after collecting the main link signal and the feedback signal.

Further, the data property processing refers to performing operations of delay aligning and energy aligning on the collected signals.

Further, the apparatus further includes:

a digital to analog converter, arranged to convert a digital signal output by the pre-corrector into an analog signal;

a nonlinear system, arranged to perform nonlinear processing on the analog signal; and an analog to digital converter, arranged to couple a signal out from the output signal by the nonlinear system, and convert the signal into a digital signal which is used as the feedback signal to be input into the adaptive device.

On the other hand, the present document further provides a method for nonlinear system distortion correction, including:

generating a robustness signal provided to an adaptive device;

collecting a main link signal output by a signal generator and a feedback signal returned by the main link signal via a feedback link, and generate a correction parameter according to the main link signal, the feedback signal and the robustness signal; and performing, according to the correction parameter, pre-correction processing on the main link signal output by the signal generator.

Further, generating a correction parameter further includes:

collecting the main link signal output by the signal generator and the feedback signal returned by the main link signal via the feedback link;

generating a linearization parameter extraction matrix Rr and a target matrix Zr according to the main link signal and the feedback signal, generating a linearization parameter extraction matrix Rs and a target matrix Zs according to the robustness signal, and performing matrix composition on the Rs, Zs and the Rr, Zr to obtain matrixes R and Z; and extracting a linearization parameter according to the matrixes R and Z, and using the linearization parameter as the correction parameter to be loaded into a pre-corrector.

Further, the pre-correction processing further includes:

calculating an amplitude value or power of the main link signal to obtain an index address of a correction signal;

looking up a corresponding lookup table according to the index address, and generating the correction signal according to contents of the lookup table; and performing the pre-correction processing on the main link signal output by the signal generator according to the correction signal and the correction parameter.

Further, the pre-correction processing is performed according to formulas (1), (2) and (3):

$$y(n) = F_{U,X}(U,X) \quad (1)$$

$$U = [U(n), U(n-1), \ldots, U(n-K)] \quad (2)$$

$$X = [x(n), x(n-1), \ldots, x(n-J)] \quad (3)$$

where, y is a pre-corrected signal; n is a signal sampling time serial number; $F_{U,X}(\bullet)$ is a pre-correction function, the correction parameter being a coefficient in the pre-correction function $F_{U,X}(\bullet)$; U is a vector of the correction signal; X is a vector of the main link signal; K is maximum delay of the correction signal; and J is maximum delay of the main link signal.

Further, the matrix composition is performed using formulas (4) and (5):

$$R = a \times Rs + b \times Rr \quad (4)$$

$$Z = a \times Zs + b \times Zr \quad (5)$$

where, a and b are weighting coefficients.

Further, generating a robustness signal includes:

performing frequency conversion, filtering and frequency shift processing on a baseband signal to obtain the main link signal and performing data property processing on the main link signal to obtain the robustness signal.

Further, after collecting the main link signal and the feedback signal, the method further includes:

performing the data property processing on the main link signal and the feedback signal.

Further, the data property processing refers to performing operations of delay aligning and energy aligning on the collected signals.

Further, a digital signal after the pre-correction processing is converted into an analog signal;

nonlinear processing is performed on the analog signal; and a signal is coupled out from the signal after the nonlinear processing and is converted into a digital signal to be returned as the feedback signal.

The beneficial effects of the present document are as follows:

The present document ensures, by providing a robustness signal, that a system will not bring the problem of unknowable abrupt change in power or abnormal output frequency spectrum, which is caused by the fact that the difference between a signal characteristic in a former configuration and a signal characteristic in a latter configuration is too large under various dynamic configurations after an actual link signal passes through a pre-distortion module, thereby greatly improving the robustness of the system in the case of dynamic operation, and being able to satisfy various frequency band configuration requirements of operators and dynamic change requirements of telephone traffic in different regions.

EMBODIMENTS OF THE PRESENT DOCUMENT

The present document will be further described in detail in combination with the accompanying drawings and embodiments below. It should be understood that the specific embodiments described herein are only used to explain the present document, not limit the present document.

The present document puts forward a universal apparatus and method for improving system robustness using a power amplifier linearization technology, so as to, by using a method of adding a robustness signal source into a conventional pre-distortion self-iteration system to participate in extracting a linearization coefficient, solve the problem of damage to a power amplifier and abnormal signal frequency spectrum which may be caused due to unstable system output power caused by a pre-distortion module under some configurations in a cross-band ultra-wideband pre-distortion system.

Figure 1:
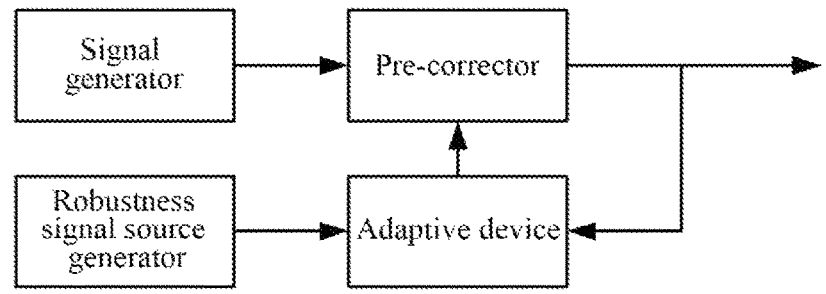
FIG. 1 is a schematic diagram of a structure of an apparatus for nonlinear system distortion correction in an embodiment of the present document.

As shown in FIG. 1, an embodiment of the present document relates to an apparatus for nonlinear system distortion correction including:

a robustness signal source, generator arranged to generate a robustness signal provided to an adaptive device;

the adaptive device, arranged to collect a main link signal output by a signal generator and a feedback signal returned by the main link signal via a feedback link and generate a correction parameter according to the main link signal, the feedback signal and the robustness signal; and a pre-corrector, arranged to, according to the correction parameter, perform pre-correction processing on the main link signal output by the signal generator.

Figure 2:
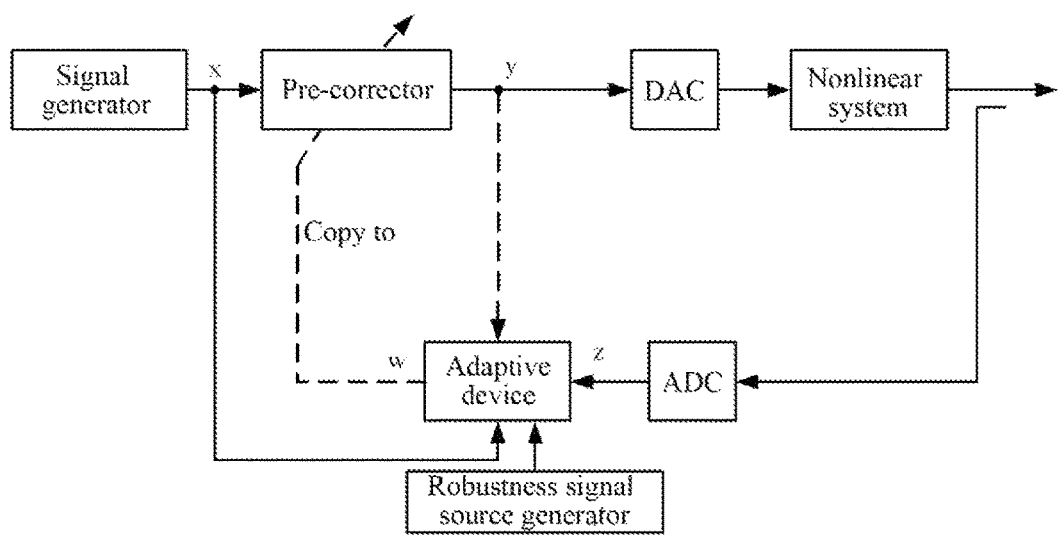
FIG. 2 is a schematic diagram of a structure of another apparatus for nonlinear system distortion correction in an embodiment of the present document.

Further, as shown in FIG. 2, based on the above embodiment, the apparatus for nonlinear system distortion correction involved in the embodiment of the present document can further include:

a digital to analog converter (DAC) arranged to convert a digital signal output by the pre-corrector into an analog signal;

a nonlinear system arranged to perform nonlinear processing on the analog signal; and an analog to digital converter (ADC) arranged to couple a signal out from the output signal by the nonlinear system, and convert the signal into a digital signal which is used as the feedback signal to be input into the adaptive device.

The robustness signal source generator performs up-conversion and filtering on a baseband signal, then performs frequency shift processing according to a configuration required by the system, obtains a main link signal consistent with the bandwidth and configuration required by the system, collects the main link signal and performs data property processing, where the data property processing process is consistent with the data property processing in the adaptive device. The processed signal is stored and used as a robustness signal source to be supplied to the adaptive device for calling.

Figure 3:
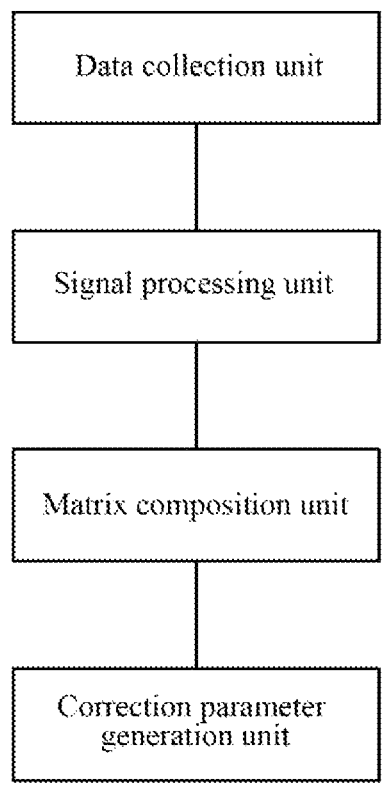
FIG. 3 is a schematic diagram of a structure of an adaptive device in an embodiment of the present document.

As shown in FIG. 3, the adaptive device includes:

a data collection unit arranged to collect the main link signal (i.e., a digital signal in a forward link) and the feedback signal (i.e., a digital signal in a power amplifier feedback link) returned by the main link signal via the feedback link;

a signal processing unit arranged to perform data property processing on the collected main link signal and feedback signal, the data property processing referring to performing operations of delay aligning and energy aligning on the collected signals; and a matrix composition unit arranged to generate a linearization parameter extraction matrix Rr and a target matrix Zr according to the main link signal and the feedback signal, generate a linearization parameter extraction matrix Rs and a target matrix Zs according to the robustness signal and perform matrix composition on the Rs, Zs and the Rr, Zr to obtain matrixes R and Z.

The matrix composition unit establishes a distortion model of the nonlinear system, and the distortion model uses a universal memory multinomial model, as shown in the following formula:

$$S_o(n) = \Sigma_{p=0}^{P} \Sigma_{k=0}^{K} \Sigma_{j=0}^{J} w_{p,k,j} |S_i(n-k)|^P S_i(n-j) \quad (6)$$

where $S_i$ is a model input signal; j is signal delay of an input signal, k is signal delay of an input signal modulus value; p is a model order; J is maximum signal delay of the input signal, k is maximum signal delay of the input signal modulus value; P is the highest model order; and $w_{p,k,j}$ is a model coefficient. Correspondingly, in the present document, $S_i$ is an output signal of a signal generator module, namely the main link signal; $S_o$ is a target matrix, namely the feedback signal.

In order to get a correction parameter W, a common calculation method called LS algorithm is generally used to obtain:

$$W = R^{-1}Z \quad (7)$$

$$R = \Sigma_{p=0}^{P} \Sigma_{k=0}^{K} \Sigma_{j=0}^{J} |S_i(n-k)|^P S_j(n-j) \quad (8)$$

where R is a parameter extraction matrix; Z is a target matrix, namely the target matrix So in the formula (6); W is a correction parameter; (•)−1 is a pseudo-inverse operation; and meanings of other expressions are the same as in the formula (6).

It should be noted that, methods for forming the parameter extraction matrix Rr and the target matrix Zr corresponding to the main link signal and the parameter extraction matrix Rs and the target matrix Zs corresponding to the robustness signal source are the same, and are all generated according to the formula (7) and formula (8).

Here, the derivation formula (8) for R has been given, i.e., it is generated by combining two items in the memory multinomial model (6), and all the physical meanings in the formula are defined expressly.

In the combination of the matrixes, the matrix composition unit performs matrix composition using formulas (4) and (5):

$$R = a \times Rs + b \times Rr \quad (4)$$

$$Z = a \times Zs + b \times Zr \quad (5)$$

where, a and b are weighting coefficients.

A correction parameter generation unit is arranged to extract a linearization parameter according to the matrixes R and Z and use the linearization parameter as the correction parameter to be loaded into the pre-corrector. Generally the linearization parameter is extracted using adaptive algorithms, such as a least squares (LS) algorithm, a recursive least squares (RLS) algorithm or a least mean square (LMS) algorithm and the like, the extracted linearization parameter is downloaded into the pre-corrector, and the correction parameter is updated and downloaded into a correction information generation unit.

Figure 4:
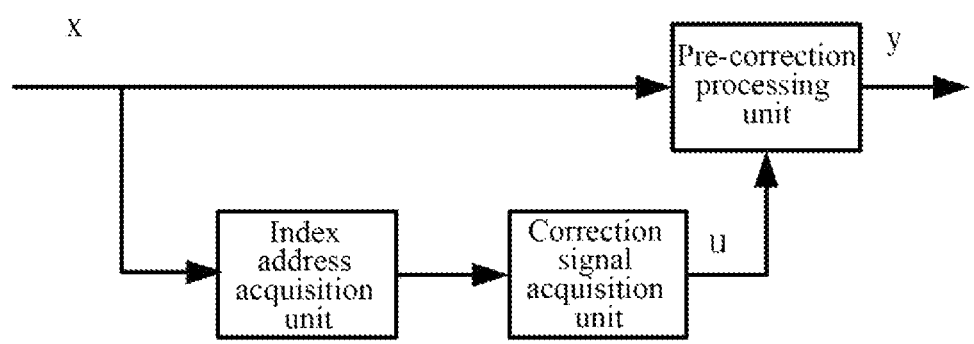
FIG. 4 is a schematic diagram of a structure of a pre-corrector in an embodiment of the present document.

As shown in FIG. 4, the pre-corrector includes:

an index address acquisition unit arranged to calculate an amplitude value or power of the main link signal to obtain an index address of a correction signal, linear or nonlinear mapping (bit truncating operation) being performed on the amplitude value or power of the input signal to generate address information, perform addressing and obtain the index address;

a correction signal acquisition unit arranged to look up a corresponding lookup table (linearization lookup table) according to the index address and obtain the correction signal according to contents of the lookup table; and a pre-correction processing unit arranged to perform the pre-correction processing on the main link signal output by the signal generator according to the correction signal and the correction parameter, where the pre-correction processing unit performs pre-correction processing according to formulas (1), (2) and (3):

$$y(n)=F_{U,X}(U,X) \quad (1)$$

$$U=[U(n),U(n-1),\ldots,U(n-K)] \quad (2)$$

$$X=[x(n),x(n-1),\ldots,x(n-J)] \quad (3)$$

where, y is a pre-corrected signal; n is a signal sampling time serial number; $F_{U,X}(\bullet)$ is a pre-correction function, the correction parameter being a coefficient in the pre-correction function $F_{U,X}(\bullet)$; U is a vector of the correction signal; X is a vector of the main link signal; K is maximum delay of the correction signal; and J is maximum delay of the main link signal.

The pre-corrector pre-corrects the main link signal according to amplitude and phase information of the signal, where the amplitude is equal to amplitude of a distortion signal generated by the nonlinear system and the phase is opposite to phase of the distortion signal, thus the distortion caused by the nonlinear system to the main link signal can be counteracted.

Conversion of the pre-corrected signal from a digital domain to an analog domain is implemented through the DAC, and nonlinear processing of the signal is implemented through the nonlinear system. The output signal of the nonlinear system is ultimately turned into a feedback digital signal through the ADC. The emphasis of the technical scheme of the present document is not the DAC, nonlinear system and ADC, thus the embodiments of the present document can be accomplished by using the existing modules above. Therefore, the above devices will not be described in detail in the embodiments of the present document.

Figure 5:
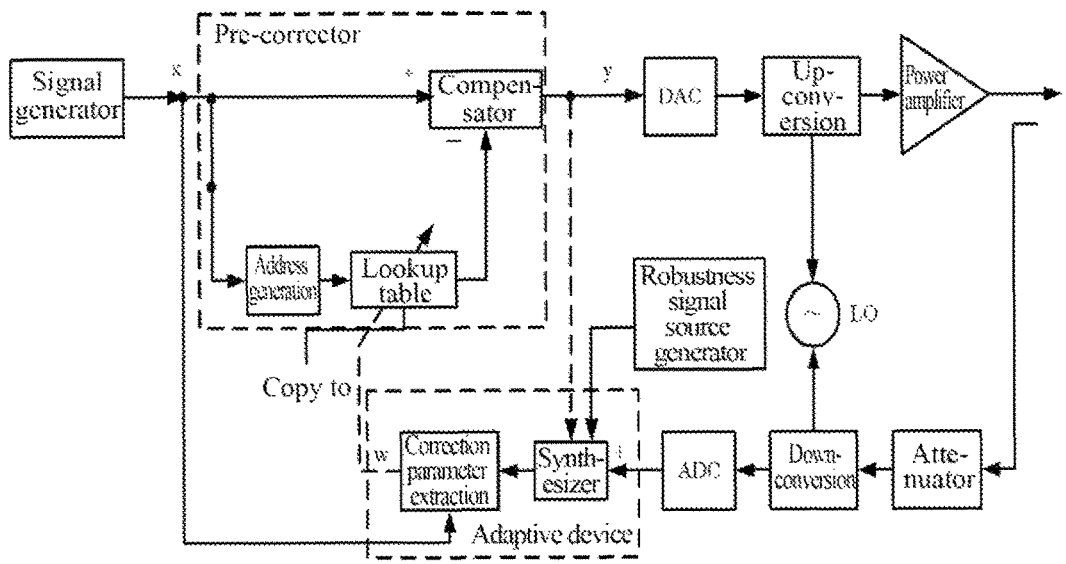
FIG. 5 is a schematic diagram of a structure of a further apparatus for nonlinear system distortion correction in an embodiment of the present document.

FIG. 5 is a specific embodiment of an apparatus for power amplifier pre-correction (an apparatus for nonlinear system distortion correction) including a signal generator module, a channel filtering module, a pre-corrector module, a DAC module, an ADC module, an up-conversion module, a down-conversion module, a local oscillator (LO) module, a power amplifier module, an attenuator module, an adaptive device module and a robustness signal source module. Compared to FIG. 2, in the implementation of the pre-corrector module, the pre-corrected signal is obtained according to the pre-correction function shown in the formula (6). In a correction parameter extraction unit of the adaptive device module, upon construction of a parameter extraction matrix, parameter extraction matrixes R obtained by the current link signal and the robustness signal source are both constructed according to the formula (8), and the matrixes R and Z eventually used for extracting the parameters are constructed according to the formulas (4) and (5).

Figure 6:
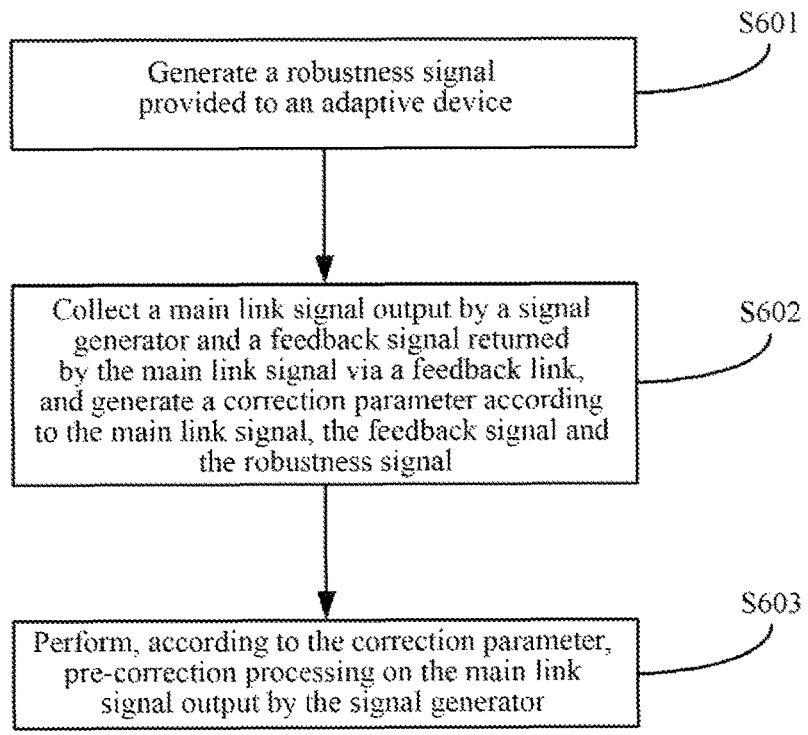
FIG. 6 is a flow chart of a method for nonlinear system distortion correction in an embodiment of the present document.

As shown in FIG. 6, an embodiment of the present document further relates to a method for nonlinear system distortion correction implemented by the above apparatus including the following steps:

Step 601: generating a robustness signal provided to an adaptive device;

Step 602: collecting a main link signal output by a signal generator and a feedback signal returned by the main link signal via a feedback link and generate a correction parameter according to the main link signal, the feedback signal and the robustness signal; and Step 603: performing, according to the correction parameter, pre-correction processing on the main link signal output by the signal generator.

Further, generating a correction parameter specifically includes:

collecting the main link signal output by the signal generator and the feedback signal returned by the main link signal via the feedback link;

generating a linearization parameter extraction matrix Rr and a target matrix Zr according to the main link signal and the feedback signal, generating a linearization parameter extraction matrix Rs and a target matrix Zs according to the robustness signal, and performing matrix composition on the Rs, Zs and the Rr, Zr to obtain matrixes R and Z; and extracting a linearization parameter according to the matrixes R and Z, and using the linearization parameter as the correction parameter to be loaded into a pre-corrector.

The pre-correction processing specifically includes:

calculating an amplitude value or power of the main link signal to obtain an index address of a correction signal;

looking up a corresponding lookup table according to the index address, and generating the correction signal according to contents of the lookup table; and performing the pre-correction processing on the main link signal output by the signal generator according to the correction signal and the correction parameter; in the step, the pre-correction processing is performed according to formulas (1), (2) and (3):

$$y(n)=F_{U,X}(U,X) \quad (1)$$

$$U=[U(n),U(n-1),\ldots,U(n-K)] \quad (2)$$

$$X=[x(n),x(n-1),\ldots,x(n-J)] \quad (3)$$

where, y is a pre-corrected signal; n is a signal sampling time serial number; $F_{U,X}(\bullet)$ is a pre-correction function, the correction parameter being a coefficient in the pre-correction function $F_{U,X}(\bullet)$; U is a vector of the correction signal; X is a vector of the main link signal; K is maximum delay of the correction signal; and J is maximum delay of the main link signal.

Matrix composition is performed using formulas (4) and (5):

$$R=a \times Rs + b \times Rr \quad (4)$$

$$Z=a \times Zs + b \times Zr \quad (5)$$

where, a and b are weighting coefficients.

Generating a robustness signal includes:

performing frequency conversion, filtering and frequency shift processing on a baseband signal to obtain the main link signal and performing data property processing on the main link signal to obtain the robustness signal. Further, after collecting the main link signal and the feedback signal, the data property processing is performed on the main link signal and the feedback signal. The data property processing refers to performing operations of delay aligning and energy aligning on the collected signals.

A digital signal after the pre-correction processing is converted into an analog signal.

Nonlinear processing is performed on the analog signal.

A signal is coupled out from the signal after the nonlinear processing and is converted into a digital signal to be returned as the feedback signal.

The technical scheme of the present document is not limited to the application in a TD-SCDMA and TDL-LTE mode mixing cross-band ultra-wideband RRU system. For a Global System for Mobile communication (GSM), Code Division Multiple Access (CDMA), Universal Mobile Telecommunications System (UMTS), Frequency Division Duplexing-Long Term Evolution (FDD-LTE) and Worldwide Interoperability for Microwave Access (WiMAX) single-mode or mixed-mode system, the effect of improving the robustness of the system using the power amplifier linearization technology is remarkable as well. The technical scheme of the present document has no particular requirements on signal modulation, bandwidth and the like, and is commonly applied to improve the robustness of various systems using the power amplifier linearization technology, which is obviously superior to the robustness of traditional systems using the power amplifier linearization technology, greatly improving the working security and performance robustness of communication systems and even the entire wireless base station system.

Although the preferred embodiments of the present document have been disclosed for the purpose of illustration, those skilled in the art will realize that various improvements, additions and replacements are also possible. Therefore, the scope of the present invention should not be limited to the above embodiments.

INDUSTRIAL APPLICABILITY

As mentioned above, an apparatus and method for nonlinear system distortion correction provided by the embodiments of the present document have the following beneficial effects: by providing a robustness signal, it is ensured that a system will not bring the problem of unknowable abrupt change in power or abnormal output frequency spectrum, which is caused by the fact that the difference between a signal characteristic in a former configuration and a signal characteristic in a latter configuration is too large under various dynamic configurations after an actual link signal passes through a pre-distortion module, thereby greatly improving the robustness of the system in the case of dynamic operation, and being able to satisfy various frequency band configuration requirements of operators and dynamic change requirements of telephone traffic in different regions.

What we claim is:

1. An apparatus for nonlinear system distortion correction comprising:
a robustness signal source generator, arranged to generate a robustness signal provided to an adaptive device;
the adaptive device, arranged to collect a main link signal output by a signal generator and a feedback signal returned by the main link signal via a feedback link, and generate a correction parameter according to the main link signal, the feedback signal and the robustness signal; and
a pre-corrector, arranged to according to the correction parameter perform pre-correction processing on the main link signal output by the signal generator,
wherein, the adaptive device is arranged to:
collect the main link signal output by the signal generator and the feedback signal returned by the main link signal via the feedback link;
generate a linearization parameter extraction matrix Rr and a target matrix Zr according to the main link signal and the feedback signal, generate a linearization parameter extraction matrix Rs and a target matrix Zs according to the robustness signal, and perform matrix composition on the Rs, Zs and the Rr, Zr to obtain matrixes R and Z; and
extract a linearization parameter according to the matrixes R and Z, and use the linearization parameter as the correction parameter to be loaded into the pre-corrector.

2. The apparatus according to claim 1, wherein, the pre-corrector is arranged to:
calculate an amplitude value or power of the main link signal to obtain an index address of a correction signal;
look up a corresponding lookup table according to the index address, and generate the correction signal according to contents of the lookup table; and
perform the pre-correction processing on the main link signal output by the signal generator according to the correction signal and the correction parameter.

3. The apparatus according to claim 2, wherein, the pre-corrector performs the pre-correction processing according to formulas (1), (2) and (3):

$$y(n)=F_{U,x}(U,X) \quad (1)$$

$$U=[U(n),U(n-1),\ldots,U(n-K)] \quad (2)$$

$$X=[x(n),x(n-1),\ldots,x(n-J)] \quad (3)$$

wherein, y is a pre-corrected signal; n is a signal sampling time serial number; $F_{U,x}(\bullet)$ is a pre-correction function, the correction parameter being a coefficient in the pre-correction function $F_{U,x}(\bullet)$; U is a vector of the correction signal; X is a vector of the main link signal; K is maximum delay of the correction signal; and J is maximum delay of the main link signal.

4. The apparatus according to claim 1, wherein the adaptive device performs the matrix composition using formulas (4) and (5):

$$R=a\times Rs+b\times Rr \quad (4)$$

$$Z=a\times Zs+b\times Zr \quad (5)$$

wherein, a and b are weighting coefficients.

5. The apparatus according to claim 1, wherein, the robustness signal source generator is arranged to generate a robustness signal by the following way:
performing frequency conversion, filtering and frequency shift processing on a baseband signal to obtain the main link signal, and performing data property processing on the main link signal to obtain the robustness signal.

6. The apparatus according to claim 5, wherein, the adaptive device performs the data property processing on the main link signal and the feedback signal after collecting the main link signal and the feedback signal.

7. The apparatus according to claim 6, wherein, the data property processing refers to performing operations of delay aligning and energy aligning on the collected signals.

8. The apparatus according to claim 7, wherein, the apparatus further comprises:
a digital to analog converter, arranged to convert a digital signal output by the pre-corrector into an analog signal;
a nonlinear system, arranged to perform nonlinear processing on the analog signal; and
an analog to digital converter, arranged to couple a signal out from the output signal by the nonlinear system, and convert the signal into a digital signal which is used as the feedback signal to be input into the adaptive device.

9. A method for nonlinear system distortion correction comprising:
generating a robustness signal provided to an adaptive device;
collecting a main link signal output by a signal generator and a feedback signal returned by the main link signal via a feedback link, and generate a correction parameter according to the main link signal, the feedback signal and the robustness signal; and
performing, according to the correction parameter, pre-correction processing on the main link signal output by the signal generator,
wherein, generating a correction parameter further comprises:
collecting the main link signal output by the signal generator and the feedback signal returned by the main link signal via the feedback link;
generating a linearization parameter extraction matrix Rr and a target matrix Zr according to the main link signal and the feedback signal, generating a linearization parameter extraction matrix Rs and a target matrix Zs according to the robustness signal, and performing matrix composition on the Rs, Zs and the Rr, Zr to obtain matrixes R and Z; and
extracting a linearization parameter according to the matrixes R and Z, and using the linearization parameter as the correction parameter to be loaded into a pre-corrector.

10. The method according to claim 9, wherein, the pre-correction processing further comprises:
calculating an amplitude value or power of the main link signal to obtain an index address of a correction signal;
looking up a corresponding lookup table according to the index address, and generating the correction signal according to contents of the lookup table; and
performing the pre-correction processing on the main link signal output by the signal generator according to the correction signal and the correction parameter.

11. The method according to claim 10, wherein, the pre-correction processing is performed according to formulas (1), (2) and (3):

$$y(n)=F_{U,x}(U,X) \quad (1)$$

$$U=[U(n),U(n-1),\ldots,U(n-K)] \quad (2)$$

$$X=[x(n),x(n-1),\ldots,x(n-J)] \quad (3)$$

wherein, y is a pre-corrected signal; n is a signal sampling time serial number; $F_{U,x}(\bullet)$ is a pre-correction function, the correction parameter being a coefficient in the pre-correction function $F_{U,x}(\bullet)$; U is a vector of the correction signal; X is a vector of the main link signal; K is maximum delay of the correction signal; and J is maximum delay of the main link signal.

12. The method according to claim 9, wherein, the matrix composition is performed using formulas (4) and (5):

$$R=a \times Rs+b \times Rr \quad (4)$$

$$Z=a \times Zs+b \times Zr \quad (5)$$

wherein, a and b are weighting coefficients.

13. The method according to claim 9, wherein, generating a robustness signal comprises:
performing frequency conversion, filtering and frequency shift processing on a baseband signal to obtain the main link signal and performing data property processing on the main link signal to obtain the robustness signal.

14. The method according to claim 13, wherein, after collecting the main link signal and the feedback signal, the method further comprises:
performing the data property processing on the main link signal and the feedback signal.

15. The method according to claim 14, wherein, the data property processing refers to performing operations of delay aligning and energy aligning on the collected signals.

16. The method according to claim 9, wherein,
a digital signal after the pre-correction processing is converted into an analog signal;
nonlinear processing is performed on the analog signal; and
a signal is coupled out from the signal after the nonlinear processing and is converted into a digital signal to be returned as the feedback signal.

17. The apparatus according to claim 1, wherein, the apparatus further comprises:
a digital to analog converter, arranged to convert a digital signal output by the pre-corrector into an analog signal;
a nonlinear system, arranged to perform nonlinear processing on the analog signal; and
an analog to digital converter, arranged to couple a signal out from the output signal by the nonlinear system, and convert the signal into a digital signal which is used as the feedback signal to be input into the adaptive device.

18. The method according to claim 9, wherein,
a digital signal after the pre-correction processing is converted into an analog signal;
nonlinear processing is performed on the analog signal; and
a signal is coupled out from the signal after the nonlinear processing and is converted into a digital signal to be returned as the feedback signal.

* * * * *